US009311997B2

(12) United States Patent
Lee et al.

(10) Patent No.: US 9,311,997 B2
(45) Date of Patent: Apr. 12, 2016

(54) RESISTIVE MEMORY DEVICE WITH WORD LINES COUPLED TO MULTIPLE SINK TRANSISTORS

(71) Applicant: SAMSUNG ELECTRONICS CO., LTD., Suwon-Si, Gyeonggi-Do (KR)

(72) Inventors: Yongkyu Lee, Gyeonggi-do (KR); Sungyeon Lee, Seoul (KR); Yeongtaek Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 150 days.

(21) Appl. No.: 14/069,499

(22) Filed: Nov. 1, 2013

(65) Prior Publication Data

US 2014/0204652 A1 Jul. 24, 2014

(30) Foreign Application Priority Data

Jan. 18, 2013 (KR) ........................ 10-2013-0005990

(51) Int. Cl.
G11C 13/00 (2006.01)
G11C 11/56 (2006.01)
G11C 29/50 (2006.01)
G11C 29/52 (2006.01)
G11C 7/10 (2006.01)
G11C 8/16 (2006.01)
G11C 11/00 (2006.01)
G11C 29/04 (2006.01)

(52) U.S. Cl.
CPC ............ *G11C 13/004* (2013.01); *G11C 7/1075* (2013.01); *G11C 8/16* (2013.01); *G11C 11/005* (2013.01); *G11C 11/5607* (2013.01); *G11C 11/5614* (2013.01); *G11C 11/5642* (2013.01); *G11C 11/5657* (2013.01); *G11C 11/5678* (2013.01); *G11C 29/50008* (2013.01); *G11C 29/52* (2013.01); *G11C 2013/0054* (2013.01); *G11C 2029/0409* (2013.01); *G11C 2029/0411* (2013.01); *G11C 2213/72* (2013.01)

(58) Field of Classification Search
CPC ...... G11C 13/004; G11C 8/16; G11C 7/1075; G11C 29/50008; G11C 29/52; G11C 11/5678; G11C 11/5607; G11C 11/5642; G11C 11/5614; G11C 11/5657; G11C 2029/0411; G11C 2029/0409; G11C 2013/0054; G11C 2213/72
USPC .................................................. 365/148, 158
See application file for complete search history.

(56) References Cited

U.S. PATENT DOCUMENTS 6,314,014 B1 11/2001 Lowrey et al.
6,947,315 B2 9/2005 Iwata
6,982,908 B2 1/2006 Cho (Continued)

*Primary Examiner* — Vanthu Nguyen
*Assistant Examiner* — Jerome Leboeuf
(74) *Attorney, Agent, or Firm* — F. Chau & Associates, LLC

(57) ABSTRACT

A resistive memory device includes memory cell array blocks, a reference cell array block, two first and second sink transistors, and a word line. Each of the memory cell array blocks includes a row line, and the reference cell array block includes a reference row line. One of the first sink transistors is disposed between one end of the row line and a ground and the other of the first sink transistors is disposed between an opposite end of the row line and the ground. One of the second sink transistors is disposed between one end of the reference row line and the ground and the other of the second sink transistors is disposed between an opposite end of the reference row line and the ground. The word line is coupled to gates of the first and second sink transistors.

14 Claims, 13 Drawing Sheets

(56) References Cited

U.S. PATENT DOCUMENTS

| | | |
|---|---|---|
| 7,054,214 B2 | 5/2006 | Hanzawa et al. |
| 7,203,112 B2 | 4/2007 | Liaw |
| 7,283,407 B2 | 10/2007 | Inoue et al. |
| 7,499,314 B2 | 3/2009 | Yang et al. |
| 7,830,705 B2 | 11/2010 | Jeong |
| 7,881,094 B2 | 2/2011 | Chen et al. |
| 7,995,379 B2 | 8/2011 | Ueda |
| 8,243,504 B2 | 8/2012 | Kang et al. |
| 8,274,819 B2 | 9/2012 | Yang |
| 8,281,221 B2 | 10/2012 | Sakimura et al. |
| 8,400,824 B2 | 3/2013 | Rho |
| 8,923,041 B2 * | 12/2014 | Andre et al. ................. 365/158 |
| 9,042,152 B2 * | 5/2015 | Kim et al. ................... 365/129 |
| 9,053,787 B2 * | 6/2015 | Shimakawa et al. |
| 2012/0155157 A1 | 6/2012 | Oh |
| 2013/0051114 A1 * | 2/2013 | Kim et al. ................... 365/145 |
| 2013/0272060 A1 * | 10/2013 | Andre et al. ................. 365/158 |
| 2013/0336052 A1 * | 12/2013 | Jurasek et al. ............... 365/163 |

* cited by examiner

RESISTIVE MEMORY DEVICE WITH WORD LINES COUPLED TO MULTIPLE SINK TRANSISTORS

CROSS-REFERENCE TO RELATED APPLICATION

This application claims priority under 35 U.S.C. §119 to Korean Patent Application No. 10-2013-0005990, filed on Jan. 18, 2013, in the Korean Intellectual Property Office, the disclosure of which is incorporated by reference herein in its entirety.

TECHNICAL FIELD

The present inventive concept relates to a resistive memory device.

DISCUSSION OF RELATED ART

Nonvolatile memory devices using a resistive memory cell include a phase change RAMs (PRAMS), nano floating gate memories (NFGMs), polymer RAMs (PoRAMs), magnetic RAMs (MRAMs), ferroelectric RAMs (FeRAMs), and resistive RAMs (RRAMs).

Resistive memory cells include a variable resistance material between an upper electrode and a lower electrode. The resistance level of the variable resistance material varies according to a voltage applied to the upper and lower electrodes. The resistance level of the resistive memory cells represents a cell data state.

SUMMARY

According to an exemplary embodiment of the present inventive concept, a resistive memory is provided. The resistive memory includes a memory cell array block, at least one reference cell array block, and a selection unit. The memory cell array block includes a plurality of memory cells. The at least one reference cell array block includes a plurality of reference cells. Each of the memory cell array block and the at least first reference cell array block includes a respective plurality of row lines and a respective plurality of bit lines. Each row line intersects each bit line without being in contact. Each bit line is coupled, through each memory cell or reference cell, to each row line at each intersection. The selection unit is configured to select an Mth bit line and an Nth row line from each of the memory cell array block and at least one reference cell array blocks and to cause cell current to flow through a memory cell that is disposed at a region where the Mth bit line and the Nth row line intersect each other in the memory cell array block and at least one reference current to flow through the at least one reference cell that is disposed at a region where the Mth bit line and the Nth row line intersect each other in the at least one reference cell array blocks.

According to an exemplary embodiment of the present inventive concept, a resistive memory is provided. The resistive memory includes a plurality of memory cell array blocks, a reference cell array block, a column decoder a reference column decoder, and a first to fourth sink transistor. Each of the plurality of memory cell array blocks and a reference cell array block includes a respective plurality of row lines and a respective plurality of bit lines. Each row line intersects each bit line without being in contact. A column decoder is configured to select one of the plurality of the memory cell array blocks and an Mth bit line of the selected memory cell array block. A reference column decoder is configured to select an Mth bit line of the reference cell array block when the column decoder selects the Mth bit line of the selected memory cell array block. A first sink transistor is coupled to an end of the respective row line of the selected memory cell array block. A second sink transistor coupled to an opposite end of the respective row line of the selected memory cell array block. A third sink transistor is coupled to an end of the respective row line of the reference cell array block. A fourth sink transistor is coupled to an opposite end of the respective row line of the reference cell array block. A plurality of word lines each is coupled to a gate of the first to fourth sink transistor.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
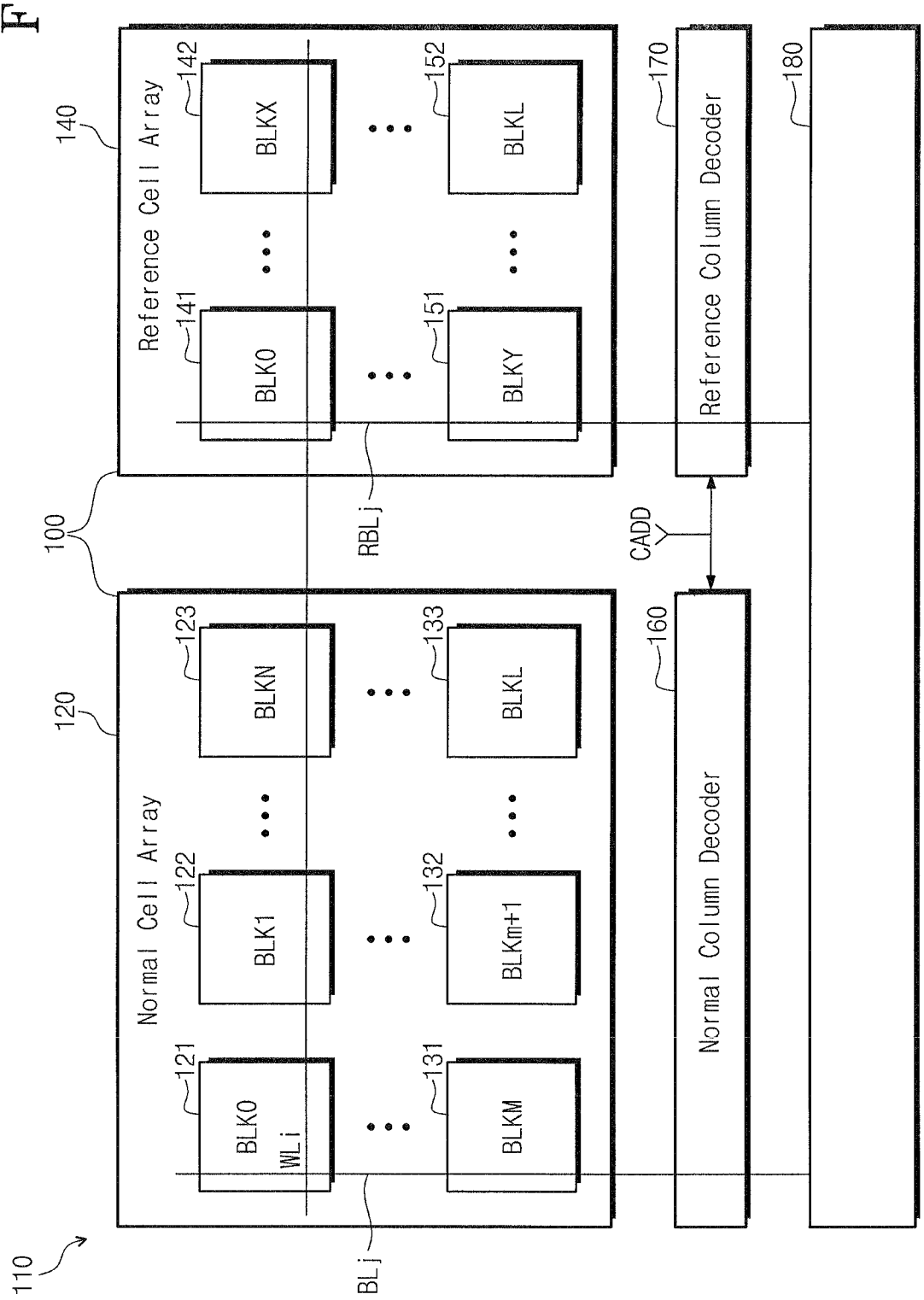
FIG. 1 is a block diagram illustrating a resistive memory device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. It will be understood that when an element is referred to as being "coupled" to another element, it may be directly coupled to another element or an intervening element may also be present. Like reference numerals may refer to the like elements throughout the specification and drawings.

FIG. 1 is a block diagram of a resistive memory device according to an exemplary embodiment of the inventive concept.

Referring to FIG. 1, a resistive memory device 110 includes a memory cell array 100, a normal column decoder 160, a reference column decoder 170, and a sense amplifier 180.

The memory cell array 100 includes a normal cell array 120 and a reference cell array 140. The normal cell array 120 includes a plurality of sub cell array blocks 121, 122, 123 . . . 131, 132, and 133, and the reference cell array 140 includes a plurality of sub reference cell array blocks 141, 142, . . . , 151, and 152.

The normal memory cell array 120 is logically divided into the plurality of sub cell array blocks 121 to 133, and one of the plurality of sub cell array blocks 121 to 133 is selected or activated at a time. The activation unit is not limited thereto, and at least two or more blocks may be activated simultaneously. Each of the plurality of the sub cell array blocks 121 to 133 includes a plurality of normal memory cells arranged in a matrix. In an exemplary embodiment, each of the normal memory cells may be a multi-level memory cell (hereinafter, referred to as an MLC) for storing at least 2-bit data including resistive RAMs (RRAMs), phase-change RAMs (PRAMs), nano floating gate memories (NF-GMs), polymer RAMs (PoRAMs), magnetic RAMs (RAMs), or ferroelectric RAMs (FeRAMs).

The reference cell array 140 includes the plurality of sub reference cell array blocks BLK0 to BLKL. A number of the plurality of the sub reference cell array blocks BLK0 to BLKL is determined by a number of the sub memory cell array blocks activated at a time of a read operation. For example, when one of the plurality of the sub memory cell array blocks is activated at a time, the reference cell array 140 includes one sub reference cell array block. When two sub memory cell array blocks of the plurality of the sub memory cell array blocks are activated at a time of a read operation, the reference cell array 140 includes two sub reference cell array blocks. In this case, the size of the sub reference cell block and the arrangement of a plurality of reference memory cells is substantially the same as the size of the sub cell array block and the arrangement of a plurality of normal memory cells. Detailed descriptions will be made in FIGS. 2 and 7.

Each of the plurality of the sub reference cell array block 141 to 152 includes a plurality of reference memory cells arranged in a matrix form. Each of the reference memory cells generates reference cell current required for sensing storage data in the normal memory cell. Thus, when the selected normal memory cell is a multi-bit memory cell, three reference memory cells are provided. The reference memory cells selected in the three sub reference cell array blocks generates a reference cell current different from each other.

A word line WLi of the normal memory cells arranged in the sub cell array block (e.g., reference numeral 121) is selected by a row decoder (not shown).

A word line RWLi of the reference memory cells arranged in the sub reference cell array block (e.g., reference numeral 141) is selected by the row decoder (not shown). In an exemplary embodiment, the row decoder is shared by the sub cell array block 121 and the sub reference cell array block 141.

Each of the plurality of the sub reference cell array blocks 141 to 152 has a cell connection structure equal to that of the sub cell array block (e.g., reference numeral 121).

For example, when a column address (CADD) is applied to the normal column decoder 160 and the reference column decoder 170, a bit line BLj of the normal memory array and a bit line RBLj of the reference memory cell array are selected. The bit line RBLj selected in the reference cell array is located in substantially the same manner as the bit line BLj selected in the normal cell array. For example, when a third bit line of the normal memory cells is selected, a third bit line of the reference memory cells is selected. Also, when a first word line of the normal memory cells is selected through the shared row decoder, a first word line of the reference memory cells is selected together.

As described above, to improve a sensing margin for a read operation, a line resistance mismatch between the normal memory cells and the reference memory cells of the sense amplifier 180 is minimized or reduced to secure the sensing margin.

The sense amplifier 180 detects a state of data stored in a selected memory cell of an activated sub normal cell array block. The sense amplifier 180 compares cell current flowing through the selected memory cell and reference cell current flowing through a selected reference cell corresponding to the selected memory cell. The selected memory cell and the selected reference cell are substantially the same position in the activated sub normal cell array block and the reference cell array block.

For convenience of description, the normal cell array 120 and the reference cell array 140 constituting the memory cell array 100 are separately arranged as shown in FIG. 1. The arrangement is not limited thereto, and the normal cell array 120 and the reference cell array 140 may be arranged in various manners.

Since the sub reference cell array block has the same size and configuration as the sub cell array block, and the reference memory cell is selected to correspond to the selected position of the normal memory cell, the line resistance mismatch of sense amplifiers between the normal memory cells and the reference memory cells is minimized. Therefore, the sensing margin reduction is prevented to improve reliability of the read operation.

Figure 2:
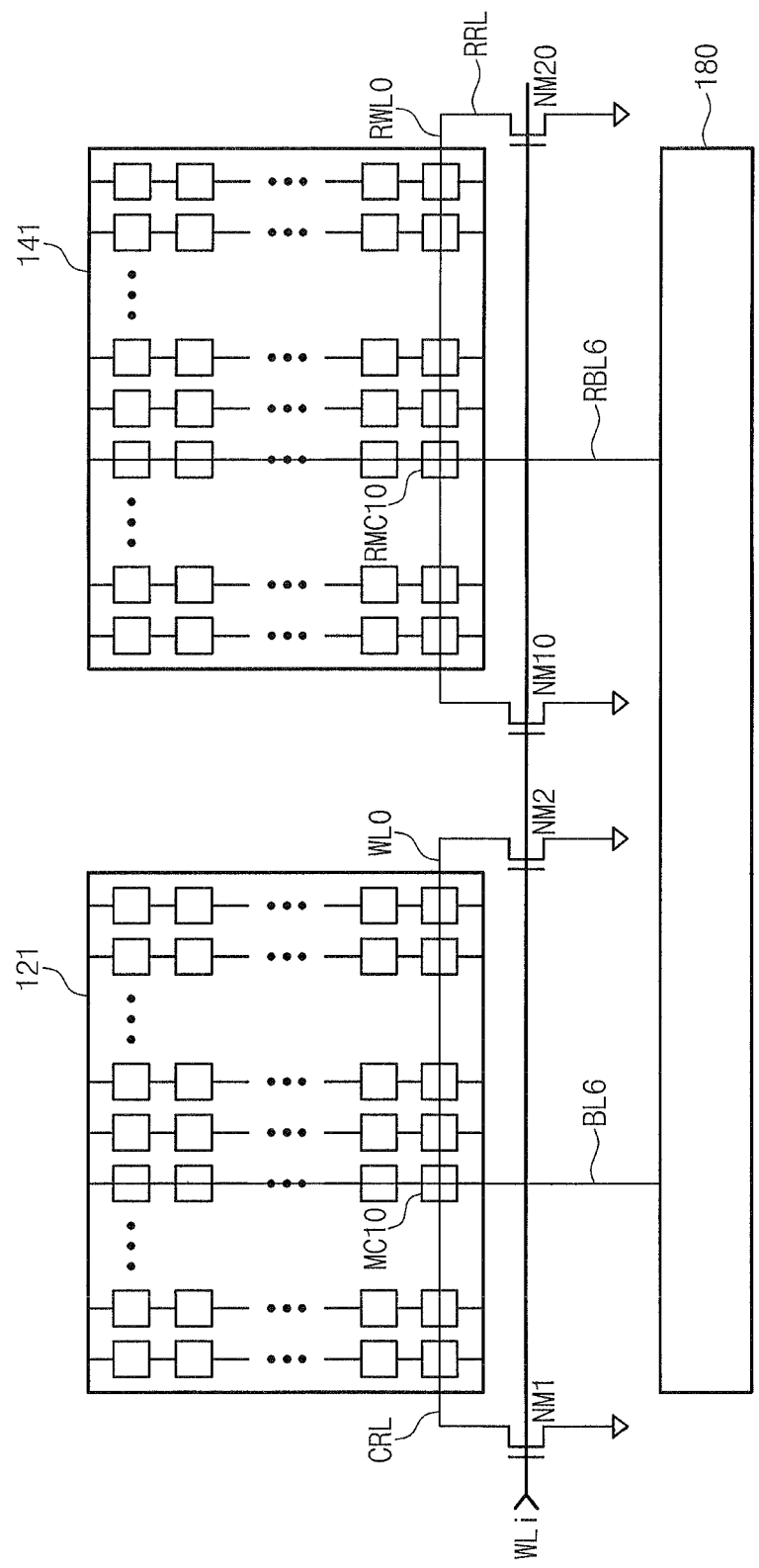
FIG. 2 is a cell array illustrating cell connections of a sub cell array block and a sub reference cell array block of FIG. 1 according to an exemplary embodiment of the present inventive concept.

FIG. 2 is the sub cell array block and the sub reference cell array block of FIG. 1 illustrating cell connection structures according to an exemplary embodiment of the inventive concept.

Referring to FIG. 2, the sub cell array block 121 and the sub reference cell array block 141 of FIG. 1 have the same cell connection structure. For example, the sub cell array block 121 and the sub reference cell array block 141 includes substantially the same number of memory cells. The memory cells of the sub cell array block 121 and the sub reference cell array block 141 are arranged in substantially the same manner. The description of the arrangement will be made in detail with reference to FIG. 6.

If it is assumed that a normal memory cell MC10 within the sub cell array block 121 is selected, a reference memory cell RMC10 within the sub reference cell array block 141 is selected by a selection operation of the word line and bit line as shown in FIG. 1. As a result, when the normal memory cell MC10 disposed at the intersection of a first row and a sixth column is accessed in a read operation, reference cell current flows through the reference memory cell RMC10 disposed at the intersection of a first row and a sixth column.

Each of transistors NM1, NM2, NM10, and NM20 serves as a sink transistor for forming a current path to the ground when a word line WLi is activated. For example, when the word line WLi is selected, all of the sink transistors NM1, NM2, NM10, and NM20 turn on.

The word line WLi is coupled to a pair of first sink transistors NM1 and NM2 in the sub cell array block 121 and a pair of second sink transistors NM10 and NM20 in the sub reference cell array block 141. When the word line WLi is activated, a cell row line CRL and a reference row line RRL are coupled to the ground. The cell row line CRL is commonly coupled to memory cells disposed in a row in the sub cell array block 121. The reference row line RRL is commonly coupled to reference memory cells in a row in the sub reference cell array block 141. The first sink transistor NM1 is disposed at an end of the cell row line CRL and the first sink transistor NM2 is disposed at an opposite end of the cell row line CRL. The second sink transistor NM10 is disposed at an end of the reference row line RRL and the second sink transistor NM2 is disposed at an opposite end of the reference row line RRL.

This arrangement of the pair of first sink transistors NM1 and NM2 reduces difference of the cell row line resistance according to the location of a selected memory cell in the cell row line CRL. This arrangement of the pair of second sink transistors NM1 and NM2 reduces difference of the reference row line resistance according to the location of a selected memory cell in the reference row line RRL.

This connection structure minimizes a line resistance mismatch of a sense amplifier 180 between the normal memory cell MC10 and the reference memory cell RMC10. Such minimization of the line resistance mismatch will be explained in detail with reference to FIG. 3.

Figure 3:
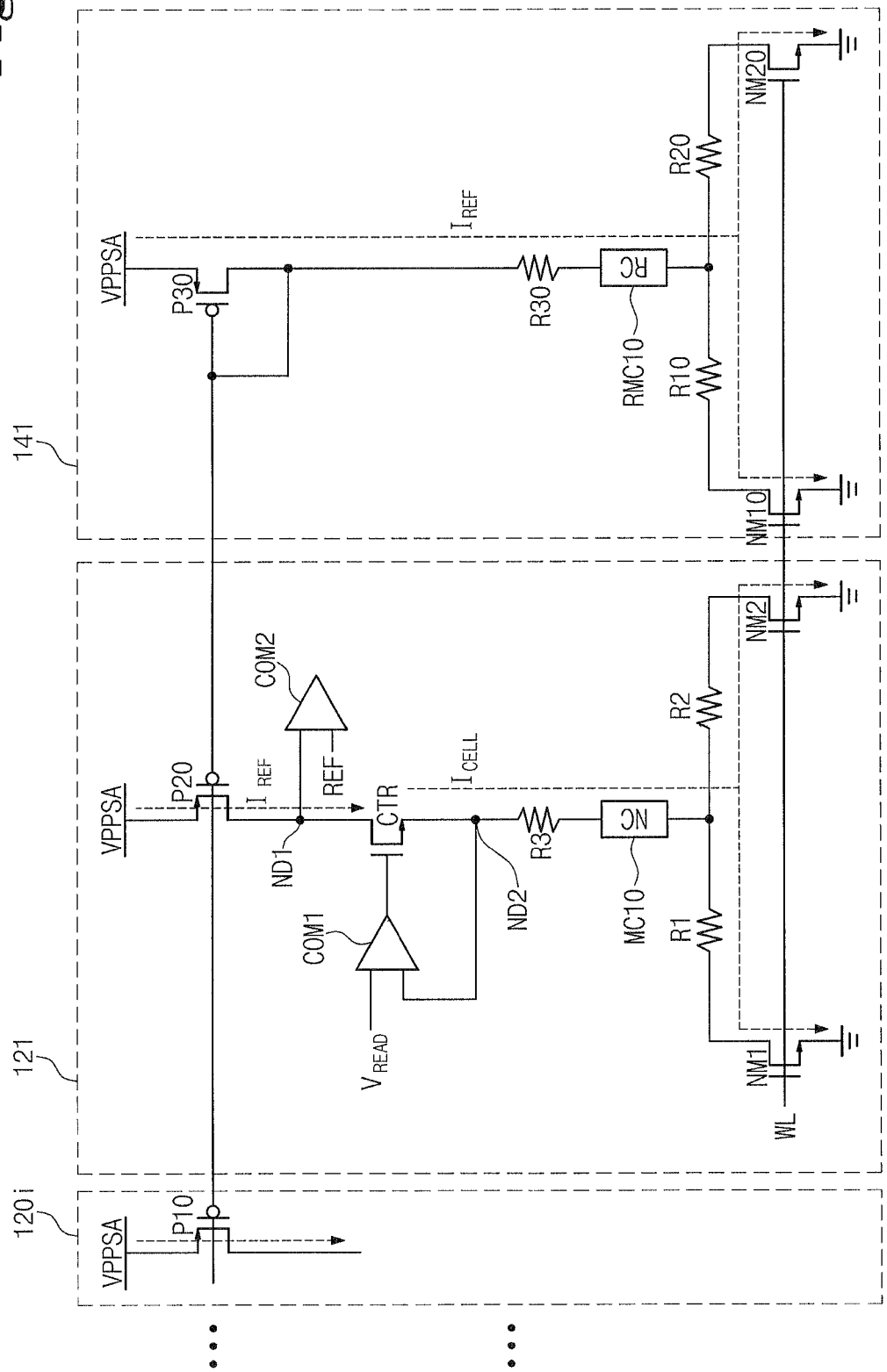
FIG. 3 is a circuit diagram illustrating a read operation path of the sub cell array block and the sub reference cell array block of FIG. 2.

FIG. 3 is a circuit diagram illustrating a read path according to an exemplary embodiment of the inventive concept.

Referring to FIG. 3, when the normal memory cell MC10 within the sub cell array block 121 is selected, the reference memory cell RMC10 within the sub reference cell array block 141 is selected. Reference cell current $I_{REF}$ flows through the bit line of the selected reference memory cell RMC10. A normal bit line within the sub cell array block 121 is coupled to the reference bit line in a current mirror structure. The reference cell current $I_{REF}$ is copied to a node ND1 disposed in the normal bit line within the sub cell array block 121. The reference cell current $I_{REF}$ is copied to a plurality of sub cell array blocks.

A comparator COM2 as a sense amplifier compares a voltage of a first node ND1 and a reference voltage REF and outputs a state of data stored in the normal memory cell MC10. The voltage of the first node ND1 is determined by difference between a cell current $I_{CELL}$ flowing into the normal memory cell MC10 and the reference current $I_{REF}$. Here, the cell current $I_{CELL}$ flowing through the normal memory cell MC10 is controlled by a clamping voltage of a clamp transistor CTR. For example, a second node is fixed to an input voltage $V_{READ}$, and the cell current $I_{CELL}$ is determined by the input voltage $V_{READ}$ and the resistances between the second node ND2 and the ground. According to an exemplary embodiment, the cell current path CCP and the reference current path RCP each has substantially the same resistance, except the memory cell MC10 and the reference memory cell RMC10. As a result, the comparator COM2 compares current difference between the memory cell MC10 and the reference memory cell RMC10, eliminating a line resistance mismatch due to a cell connection structure of the comparator COM2 that serves as a sense amplifier.

In FIG. 3, the reference memory cell RMC10 has a reference current path RCP substantially similar to a cell current path CCP of the normal memory cell MC10. The cell current path CCP includes a bit line resistance R3, a resistance of the normal memory cell MC10, and cell row resistances R1 and R2. The reference current path RCP includes a reference bit line resistance R30 corresponding to the bit line resistance R3, a resistance of the reference memory cell RMC10, and reference row resistances R10 and R20 corresponding to the cell row resistances R1 and R2. The normal bit line resistance R3 is substantially the same as the reference bit line resistance R30. The cell row resistances R1 and R2 are substantially the same as the reference row resistances R10 and R20.

As described above, when data sensing is performed using the reference memory cells, the same connection structure of row lines and bit lines disposed in the normal cell array and the reference cell array minimizes a line resistance mismatch of a sense amplifier. Such reduction of the line resistance mismatch of a sense amplifier increases its sensing margin.

In an exemplary embodiment, when the normal memory cell is the MLC, the normal memory cell stores at least 2-bit data.

Figure 4:
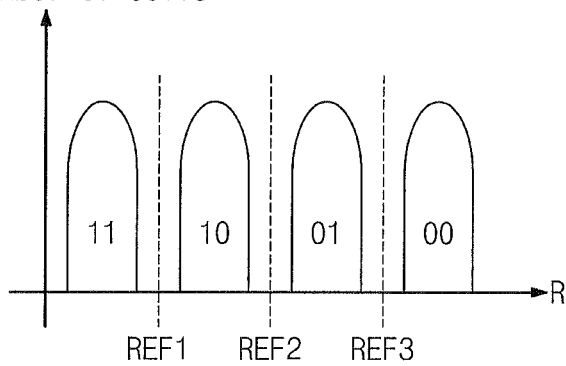
FIG. 4 is a graph illustrating an exemplary data distribution state of a multi-level resistive memory cell according to an exemplary embodiment of the present inventive concept.

FIG. 4 is a graph illustrating a data distribution of multi-level resistive memory cells according to an exemplary embodiment of the inventive concept.

Referring to FIG. 4, a horizontal axis represents resistance R of a resistive memory cell, and a horizontal axis represents the number of multi-level resistive memory cells.

Multi-bit resistive memory cells each has four states indicating data "00", data "01", data "10", or data "11" according to its resistance value.

In FIG. 4, the data "11" corresponds to a low resistance state, and the data "01", the data "10", and the data "00" correspond to a high resistance state. An operation for recording the data "11" in the MLC may be referred to as a set operation, and an operating for recording the data "01", the data "10", and the data "00" may be referred to as a reset operation. However, the memory states are not limited thereto. For example, the data "11" may correspond to the high resistance state, and the data "01", the data "10", and the data "00" may correspond to the low resistance state.

When the data "11" is recorded (written) in the MLC, the MLC may correspond to an "ON" state. Also, when the data "01", the data "10", and the data "00" are recorded in the MLC, the MLC may correspond to an "OFF" state. When the MLC is in the "OFF" state such as the data "01", "10", and "00", resistance may be significantly large. For example, the resistance may be above several mega ohms MΩ.

As described above, when the MLC has relatively high resistance, the reference memory cell providing reference current is provided. Then, the current flowing through the MLC and the reference cell current flowing through the reference memory cell is compared to each other to sense data stored in the MLC.

In FIG. 4, a state of the data stored in the MLC is determined by reference cell current values REF1, REF2, and REF3 provided from the three reference memory cells. For example, the reference cell current value REF1 is used to determine whether the normal memory cell is in the state of data "11". Also, the reference cell current value REF2 is used to determine whether the normal memory cell is in the state of data "10" or data "01". Also, the reference cell current value REF3 is used to determine whether the normal memory cell is in the state of data "01" or data "00".

Figure 5:
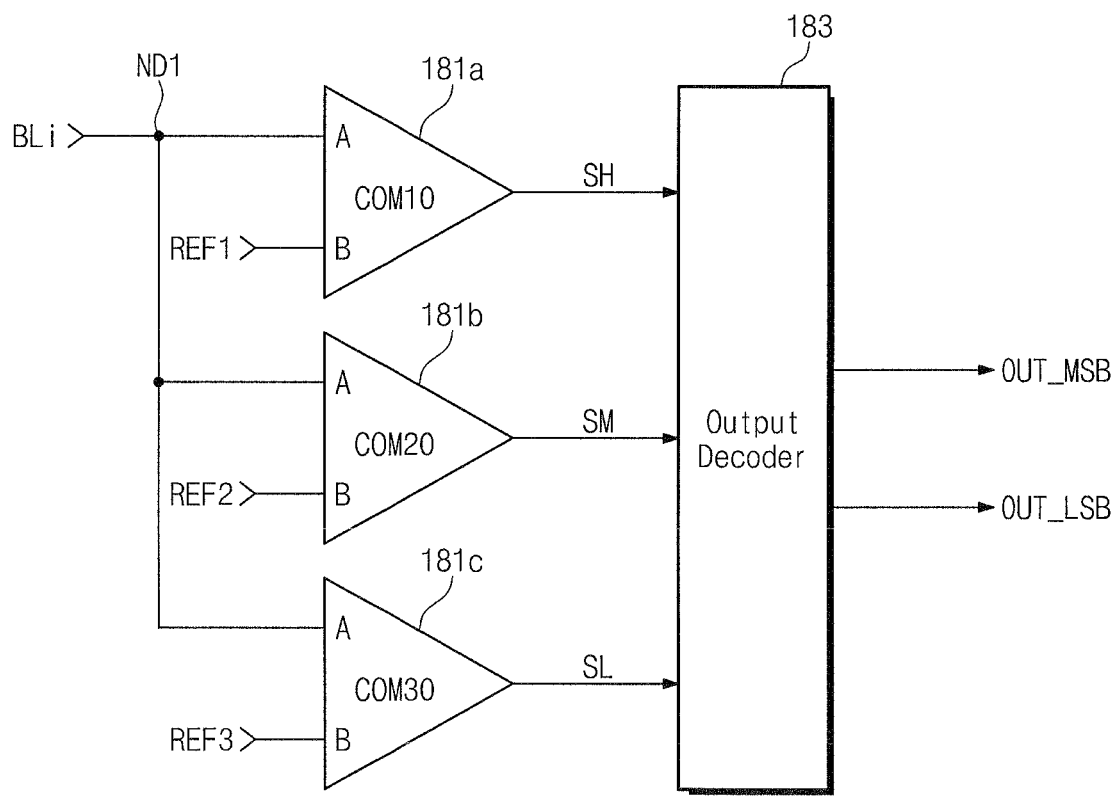
FIG. 5 is a block diagram illustrating a multi-bit data sensing unit according to an exemplary embodiment of the present inventive concept.

FIG. 5 is a circuit block diagram illustrating a multi-bit data sensing unit according to an exemplary embodiment of the inventive concept.

Referring to FIG. 5, when the normal memory cells have resistance distribution as shown in FIG. 4, a data sensing unit for sensing data stored in the selected normal memory cell includes three comparators 181a, 181b, and 181c and an output decoder 183.

The cell current of the bit line BLi of the selected normal memory cell is applied into first input terminals A of the comparators 181a, 181b, and 181c via the node ND1.

The reference cell current REF1, REF2, and REF3 are correspondingly applied to second input terminals B of the comparators 181a, 181b, and 181c, respectively.

The comparator 181a outputs a high-order comparison output value SH as "1" or "0". The comparator 181b outputs a middle-order comparison output value SM as "1" or "0".

Also, the comparator 181c outputs a low-order comparison output value SL as "1" or "0".

The outpour decoder 183 decodes the comparison output values to output "1" or "0" to a highest-order bit output terminal OUT_MSB. Also, the output decoder 183 decodes the comparison output values to output "1" or "0" to a lowest-order output terminal OUT_MSB. Thus, an output of the selected sense amplifier has one state of four data states, i.e., "00", "01", "10", and "11".

Figure 6:
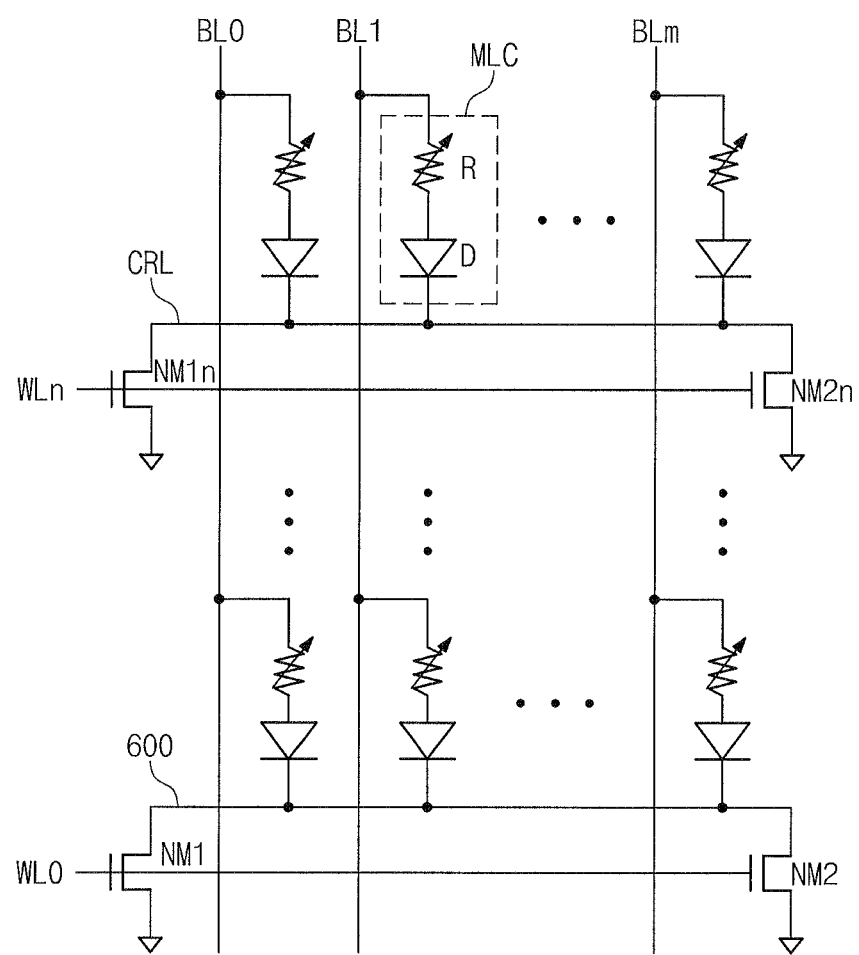
FIG. 6 is a circuit diagram illustrating the sub cell array block or the sub reference cell array block of FIG. 1 according to an exemplary embodiment of the present inventive concept.

FIG. 6 is a circuit diagram illustrating the sub cell array block of FIG. 1.

Referring to FIG. 6, an MLC 500 includes a variable resistance device R and a selection device D. The cell structure of the MLC 500 is not limited thereto. For example, the MLC 500 may have different cell structures. The variable resistance device R has one end coupled to the bit line BL1 and the other end coupled to the selection device D. The selection device D has one end coupled to the other end of the variable resistance device R and the other end coupled to the word line WLn. Here, the selection device D is formed of a diode, but the selection device D is not limited thereto. The selection device D may be formed using a switching device such as a transistor.

The variable resistance device R may include a lower electrode, a variable resistance material layer, and an upper electrode. The variable resistance material layer may be disposed between the lower electrode and the upper electrode. Each of the lower electrode and the upper electrode may be formed of a conductive material. For example, each of the lower electrode and the upper electrode may include an oxidation resistant metal layer or a polysilicon layer. For example, the oxidation resistant metal layer may be formed of a conductive material including, but is not limited to, platinum (Pt), iridium (Ir), iridium oxide (IrO), titanium aluminum nitride (TiAlN), tungsten (W), molybdenum (Mo), ruthenium (Ru), or ruthenium oxide (RuO). The oxidation resistant metal layer may be formed after a buffer layer is formed.

The variable resistance material layer may be formed of perovskite-based oxide or transition metal oxide. The perovskite-based oxide may include, but is not limited to, Pr1-xCaxMnO3, La1-xCaxMnO3, SrZrO3/SrTiO3, CrTiO3, or Pb(Zr, Ti)O3/Zn1-xCdxS. The transition metal may include, but is not limited to, nickel, niobium, titanium, zirconium, hafnium, cobalt, iron, copper, manganese, zinc, or chrome. In this case, the variable resistance material layer may have variable resistance according to a voltage applied between the lower electrode and the upper electrode.

In FIG. 6, the sink transistors are coupled to both ends of each of the rows of the memory cells. For example, when the word line WLn is activated, the both sink transistors NM1n and NM2n are turned on, and then, a current path is formed, through the MLC 500, between the selected bit line BL1 and the ground. Sink transistors corresponding to the sink transistors NM1n and NM2n is disposed in the sub reference cell array block. As a result, when a word line is activated, at least two sink transistors are turned on. As shown in FIG. 6, the sub reference cell array block and the sub cell array block have a substantially same block size, number of cells, and cell connection structure to prevent a line resistance mismatch of a sense amplifier from occurring.

Figure 7:
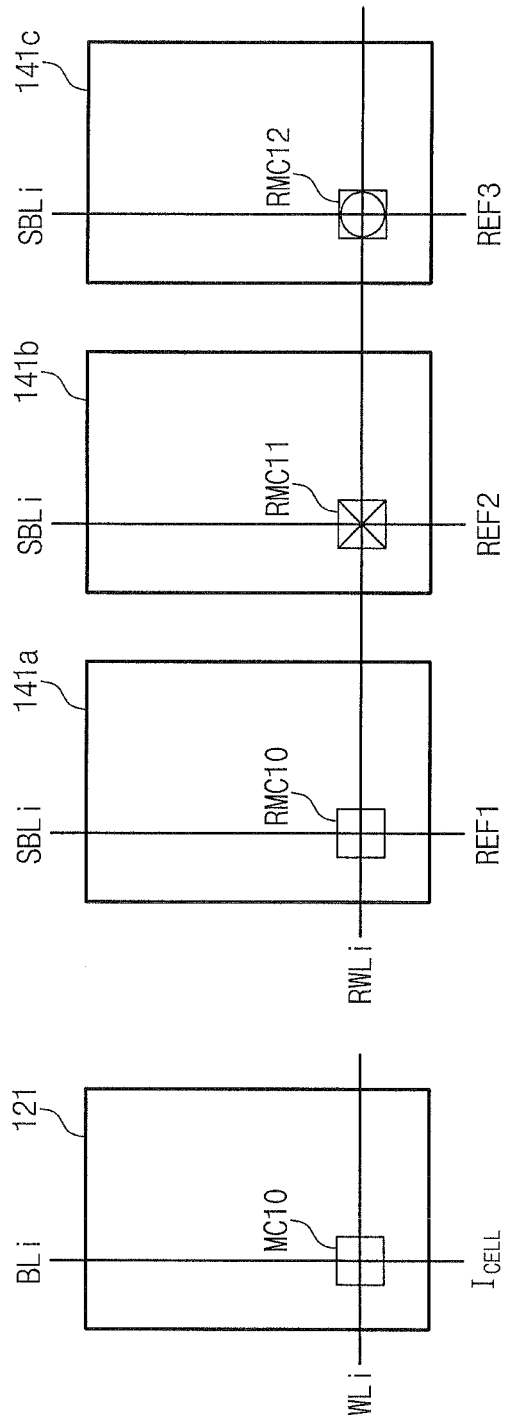
FIG. 7 is a block diagram illustrating an arrangement relationship between the sub cell array block and the sub reference cell array blocks of FIG. 1 according to an exemplary embodiment of the present inventive concept.

FIG. 7 is a block diagram illustrating an arrangement of the sub cell array block and the sub reference cell array blocks of FIG. 1.

Referring to FIG. 7, when the normal memory cells constituting the sub cell array block 121 are the MLCs, three reference currents different from each other may be required. Thus, three sub reference cell array blocks 141a, 141b, and 141c are disposed. For example, the first reference cell current REF1 flows through the reference memory cell RMC10 selected within the sub reference cell array block 141a. Also, the second reference cell current REF2 flows through the reference memory cell RMC11 selected within the sub reference cell array block 141b. Also, the third reference cell current REF3 flows through the reference memory cell RMC12 selected within the sub reference cell array block 141c.

When a read operation is performed, the reference memory cells RMC10, RMC11, and RMC12 within the three sub reference cell array blocks 141a, 141b, and 141c may simultaneously or successively generate first, second, and third reference cell current to sense data of an MLC MC10.

In this case, since the reference memory cells are selected to correspond to the positions of the cells of the selected normal memory cells, the line resistance mismatch is minimized.

Figure 8:
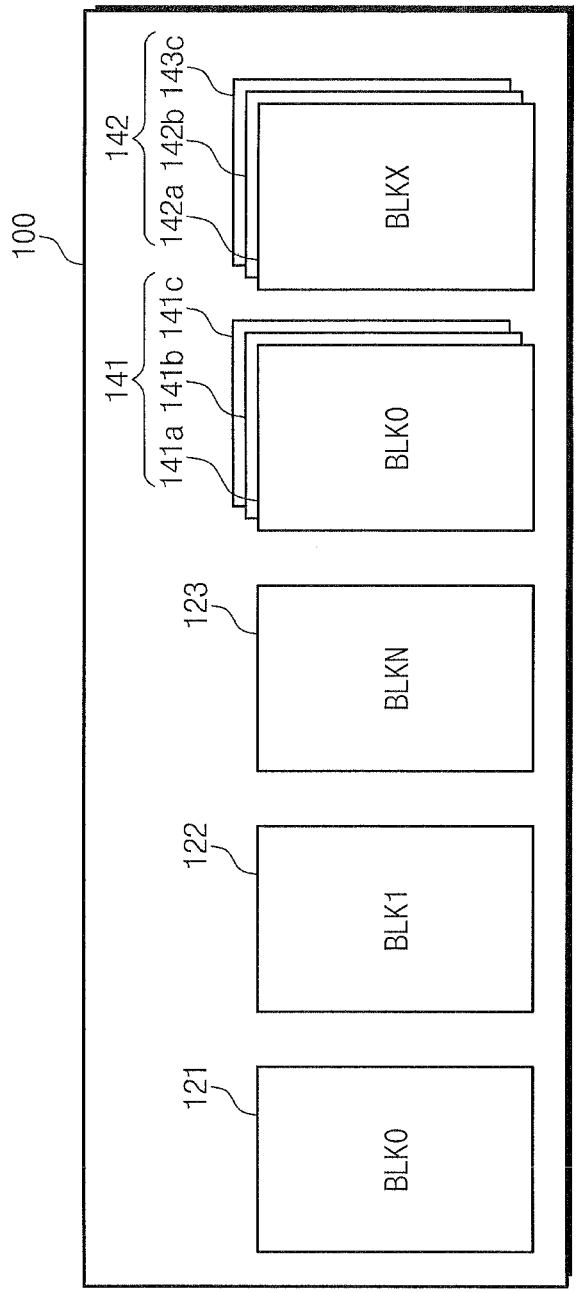
FIG. 8 is a block diagram illustrating an arrangement of sub cell array blocks and reference cell array blocks according to an exemplary embodiment of the present inventive concept.

FIG. 8 is a memory array illustrating an arrangement of a plurality of sub cell array blocks and a plurality of reference cell array blocks according to an exemplary embodiment of the inventive concept.

Referring to FIG. 8, the sub reference cell array blocks 141 and 142 within the memory cell array 100 are separately disposed with respect to the sub cell array blocks 121, 122, and 123.

As a result, when at least two sub cell array blocks are disposed, the sub reference cell array blocks are separately disposed on an edge of the sub cell array blocks.

Figure 9:
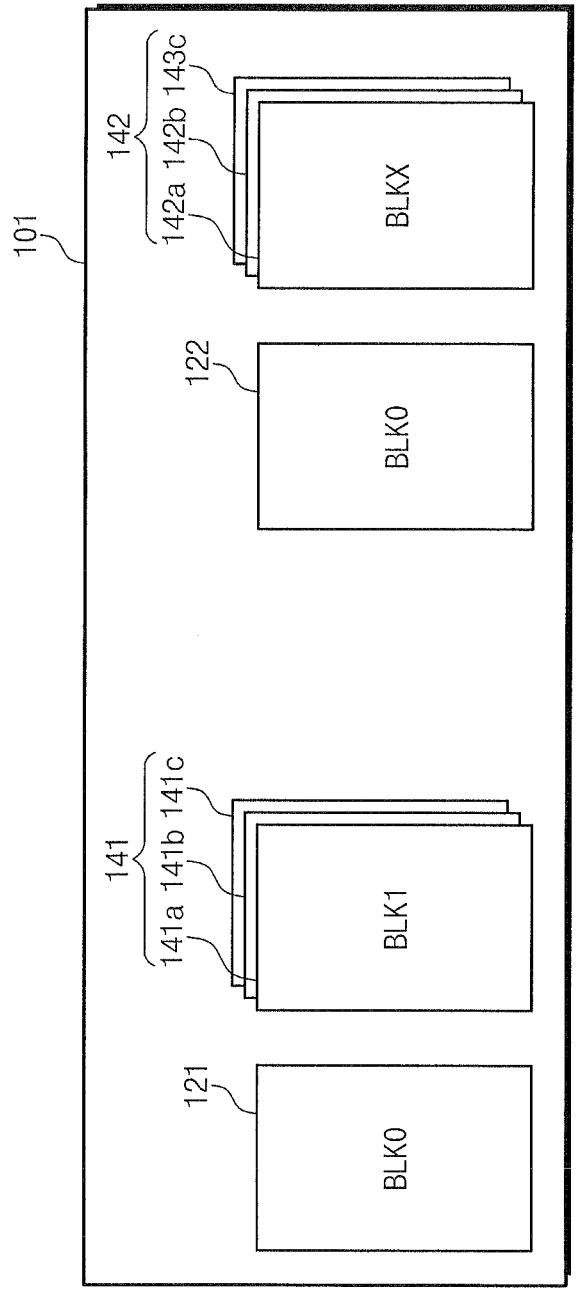
FIG. 9 is a block diagram illustrating an arrangement of sub cell array blocks and reference cell array blocks according to an exemplary embodiment of the present inventive concept.

FIG. 9 is a memory array illustrating an arrangement of a plurality of sub cell array blocks and a plurality of reference cell array blocks according to an exemplary embodiment of the inventive concept.

Referring to FIG. 9, sub reference cell array blocks 141 and 142 are disposed adjacent to their corresponding sub cell array blocks 121 and 122.

As a result, when at least two sub cell array blocks are disposed, the sub reference cell array block is disposed between the sub cell array blocks.

Figure 10:
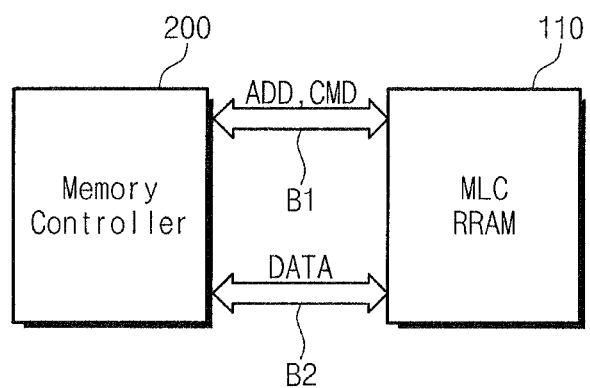
FIG. 10 is a block diagram of a memory device coupled to a memory controller according to an exemplary embodiment of the present inventive concept.

FIG. 10 is a block diagram illustrating a memory device coupled to a memory controller according to an exemplary embodiment the inventive concept.

Referring to FIG. 10, a resistive memory device, e.g., RRAM 100 may include a multi-bit memory cells. For example, the RRAM 100 may include the cell array blocks as shown in FIG. 1. Also, for example, the RRAM 110 may have the cell array blocks arrangement as shown in FIG. 8 or 9.

The RRAM 110 is coupled to a memory controller 200 through buses B1 and B2. The memory controller 200 may be included in a chip set, a CPU (central processing unit), or a processor.

The bus B1 transmits an address and command applied from the memory controller 200 to the RRAM 110.

When a writing operation is performed, the bus B2 transmits data from the memory controller 200 to the RRAM 110. When a reading operation is performed, the data read from the RRAM 110 is transmitted to the memory controller 200.

As shown in FIG. 10, the RRAM 110 having a cell array according an exemplary embodiment of the inventive concept has a high sensing margin, the memory system may perform a reliable read operation.

In an exemplary embodiment, the RRAM 110 may include a STT-MRAM including a STT-MRAM cell. For example, the STT-MRAM cell may include a magnetic tunnel junction (MTJ) device. The MTJ device may include a pinned layer and a free layer which are separated by an insulation (tunnel barrier) layer. Here, each of the pinned layer and the free layer may include magnetic properties.

The MTJ device may be grown on a metal layer that is known as a bottom electrode (BE) plate. Mechanical surface characteristics of the BE plate, for example, surface flatness or roughness may affect performance of the MTJ device. For example, the BE plate may be formed of a polished hard metal, for example, a titanium alloy having mechanical characteristics adequate to be formed on the MTJ device or metal similar to the titanium alloy.

As a result, an MRAM may be a memory using a magnetic characteristic in which electrons each has a spin-up status and a spin-down status among magnetic characteristics. For example, the MRAM may be a nonvolatile memory technology using magnetic elements. For example, a spin transfer torque magneto-resistance random access memory (STEM-RAM) may use electrons which are spin-polarized by passing through a thin film (a spin filter). Also, a STT-MRAM may be divided into a spin transfer torque RAM (STT-RAM), a spin torque transfer magnetization switching RAM (spin-RAM), and a spin momentum transfer RAM (SMT-RAM).

A typical MRAM using a so-called magneto-resistance effect that varies resistance of a conductive material may include a plurality of resistive memory cells formed through a magnetic tunnel junction (MTJ).

Tunnel current (or tunneling resistance) flowing through an insulator may vary according to a magnetized state of a ferromagnetic body. The MJT may include a free layer, a pinned layer, and a ferromagnetic body disposed between the free layer and the pinned layer. When the free layer and the pinned layer have magnetization directions parallel to each other, the tunneling resistance may be minimized. On the other hand, when the free layer and the pinned layer have magnetization directions semi-parallel to each other, the tunneling resistance may be maximized. When an anti-ferromagnetic layer that is called a pinning layer is added to the pinned layer, the magnetization direction of the pinned layer may be fixed, and the tunneling resistance may vary according to the magnetization direction of the free layer. Here, the magnetization direction of the free layer may be switched using a magnetic field formed by current flowing along a bit line and a word line. However, in the above-described method, as the resistive memory device is highly integrated, coercivity of the free layer may increase to switch an undesired free layer. Thus, interest with respect to a magnetic memory device using a spin transfer torque (STT) method or a magnetic memory device using a toggle switching writing method is increasing.

The magnetic memory device using the STT method may provide a current in a direction in which a spin is polarized in the magnetic memory device to switch the free layer in a desired direction by using spin transfers of electrons. Thus, since a small cell size cell needs less current, the resistive memory device may be highly integrated.

A word line and a bit line may cross each other at an angle of about 45° therebetween. The MIR may include a second magnetic region, a tunneling barrier, and a first magnetic region which are successively stacked. Here, the first and second magnetic regions may include a synthetic anti-ferromagnetic (SAF) structure including an upper ferromagnetic layer, a lower ferromagnetic layer, and an anti-ferromagnetic coupling spacer layer inserted between the upper ferromagnetic layer and the upper ferromagnetic layer.

Figure 11:
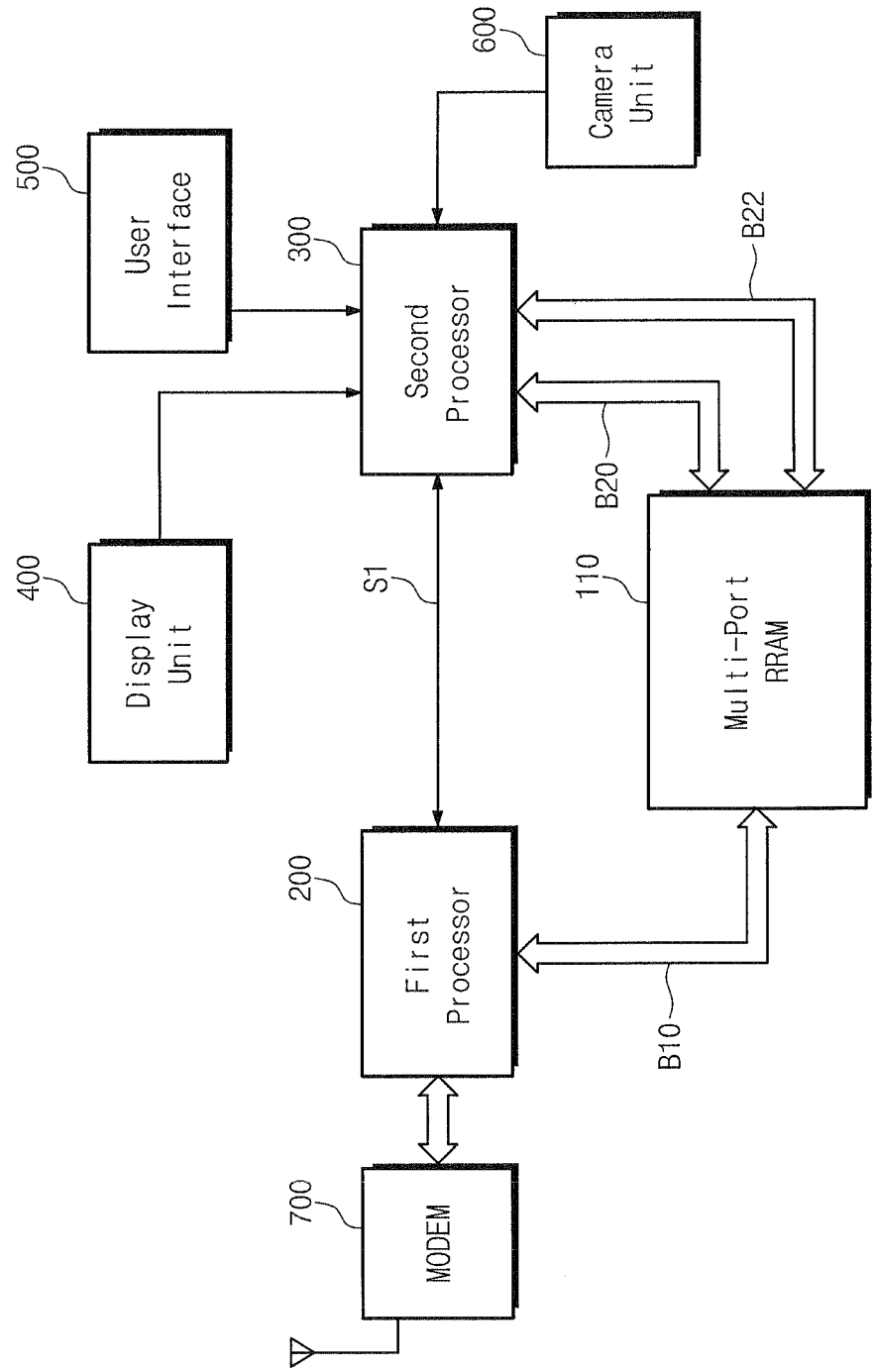
FIG. 11 is a block diagram illustrating a mobile device according to an exemplary embodiment of the present inventive concept.

FIG. 11 is a block diagram illustrating a mobile device according to an exemplary embodiment of the inventive concept.

Referring to FIG. 11, a mobile device includes a multi-port RPAM 110, a first processor 200, a second processor 300, a display unit 400, a user interface 500, a camera unit 600, and a modem.

The multi-port RRAM 110 includes three ports coupled to first to third buses B10, B20, and B22. Also, the multi-port RRAM 110 is coupled to the first and second processors 200 and 300. For example, the first port of the multi-port RRAM 110 is coupled, through the first bus B10, to the first processor 200 that serves as a baseband processor, and the second port of the multi-port RRAM 110 is coupled, through the second bus B20, to the second processor 300 that serves as an application processor. Also, the third port of the multi-port RRAM 110 is coupled, through the third bus B22, to the second processor.

Thus, one multi-port RRAM 110 may serve as a memory including one non-volatile storage memory and two DRAMs.

As a result, the RRAM 110 of FIG. 11 may include the three ports to serve as a DRAM and a flash memory. In this case, the multi-port RRAM 110 may perform a read operation by using a reference memory cell selection method having a low read error rate to reduce read errors. Also, since one memory device performs functions of two DRAMs and one flash memory, the system may be reduced in size, and system realization costs may be inexpensive. Furthermore, since a connection structure of existing processors is adopted without being modified, the RRAM 110 may be compatible to the mobile device.

An interface of the first bus B10 may be a volatile memory interface. The first port coupled to the first bus B10 may receive a first packet data DQ1/ADDR1/CMD1 generated from the first processor 200 to transmit the first packet data DQ1/ADDR1/CMD1 to an internal circuit block of the multi-port RRAM 110. Also, the first port provides first data of the multi-port RRAM 110 to the first processor 200. In this case, the first data may be parallel data.

An interface of the third bus B22 may also be a volatile memory interface. The third port coupled to the third bus B22 receives a third packet data DQ3/ADDR3/CMD3 generated from the second processor 200 to transmit the third packet data DQ3/ADDR3/CMD3 to the internal circuit block of the multi-port RRAM 110. Also, the third port provides third data of the multi-port RRAM 110 to the second processor 300.

In this case, the first and third data may be serial or parallel data.

An interface of the second bus B20 may be a nonvolatile memory interface such as a NAND flash memory. The second port coupled to the second bus B20 receives a second packet data DQ2/ADDR2/CMD2 generated from the second processor 300 to transmit the second packet data DQ2/ADDR2/ CMD2 to the internal circuit block of the multi-port RRAM 110. Also, the second port provides second data of the multi-port RRAM 110 to the second processor 300. In this case, the second data may be serial or parallel data.

The first and second processors 200 and 300 and the RRAM 100 may be integrated into one chip or may be packaged in one package. As a result, the RRAM 110 may be incorporated in the mobile device.

When the mobile device is a portable communication device, a modem 700 for performing a communication data transmission/reception function and a data modulation/demodulation function may be coupled to the first processor 200.

A NOR-type or NAND-type flash memory may be additionally coupled to the first or second processor 200 or 300 to store large-capacity information.

The display unit 400 may include a touch screen as a device such as a liquid crystal including a backlight, a liquid crystal including an LED light source, or an OLED. The display unit 400 may serve as an output device for displaying images such as character, figure, and pictures in color.

In an exemplary embodiment, the RRAM may be incorporated in a smart card.

The mobile device may be coupled to an external electronic device through a separate interface. The electronic device may include, but is not limited to, a digital versatile disc (DVD) player, a computer, a set top box (STB), a game console, or a digital camcorder.

The camera unit 600 includes a camera image processor (CIS) and is coupled to the second processor 300.

In an exemplary embodiment, an application chipset or a mobile DRAM may be further provided to the mobile device.

The RRAM 110 chip may be mounted by using packages having various shapes. The chip may be packaged as a package on package (PoP), a ball grid array (BGA), a chip scale package (CSP), a plastic leaded chip carrier (PLCC), a plastic dual in-line package (PDIP), a die in waffle pack, a die in wafer form, chip on board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), system in package (SIP), a multi chip package (MCP), a wafer-level fabricated package (WFP), or s wafer-level processed stack package (WSP).

In an exemplary embodiment, the RRAM 110 may store data information having various data types such as texts, graphics, and software codes.

The nonvolatile memory interface may include a memory interface for a nonvolatile memory including, but is not limited to, an electrically erasable programmable read-only memory (EEPROM), a flash memory, a conductive bridging RAM (CBRAM), a ferroelectric RAM (FeRAM), a phase change RAM (PRAM) that is called an ovonic unified memory (OUM), a nanotube RRAM, a polymer RAM (PoRAM), a nano floating gate memory (NFGM), a holographic memory, a molecular electronics memory device, or an insulator resistance change memory.

The RRAM 110 of FIG. 11 may serve as a memory including a DRAM and a small-capacity flash memory in cellular phones, tablet PCs, or Notebook computers. In this case, the RRAM 110 having a memory array according to an exemplary embodiment may enable the mobile device to perform a reliable read operation.

Figure 12:
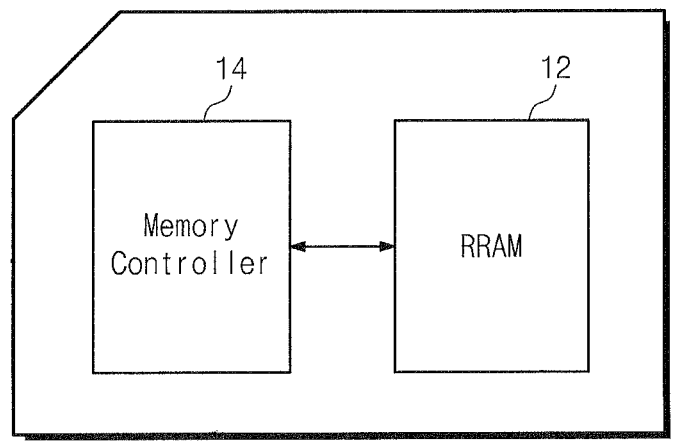
FIG. 12 is a block diagram illustrating a smart card including a resistive memory device according to an exemplary embodiment of the present inventive concept.

FIG. 12 is a block diagram illustrating a smart card including a resistive memory device according to an exemplary embodiment of the inventive concept.

Referring to FIG. 12, a smart card 10 includes a memory controller 14 and a semiconductor memory device 12. Here, the semiconductor memory device 12 may be, for example, realized by using the RRAM in which read errors are minimized. The memory controller 14 writes data required for operating the smart card having the RRAM 12. When the RRAM 12 receives a read command, since a reference current is generated from a reference memory cell disposed in a location corresponding to a selected normal memory cell, the read operation may be performed without reducing the sensing margin.

Figure 13:
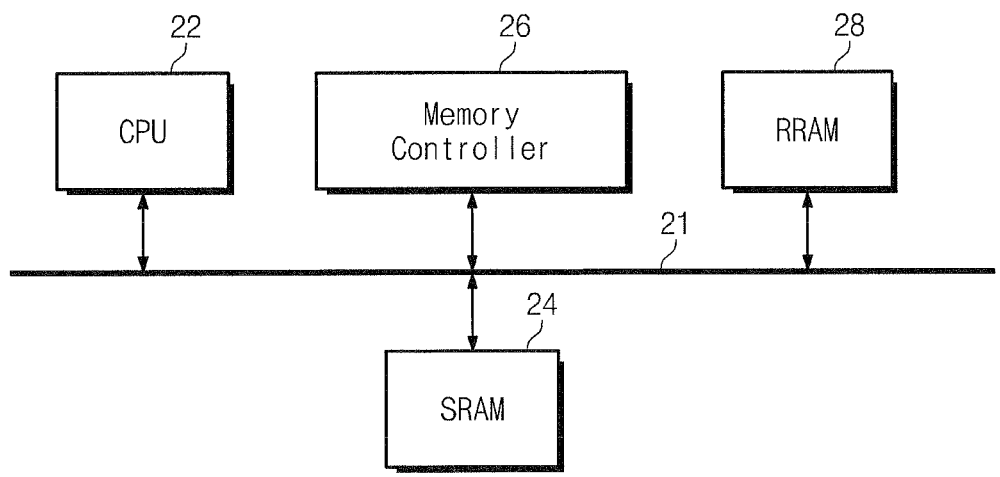
FIG. 13 is a block diagram illustrating a memory system including a resistive memory device according to an exemplary embodiment of the present inventive concept.

FIG. 13 is a block diagram illustrating a memory system including a resistive memory device according to an exemplary embodiment of the inventive concept.

Referring to FIG. 13, a memory system 20 includes a CPU 22 electrically coupled to a bus 21, a static random access memory (SRAM) 24, a memory controller 26, and a RRAM 28. Here, the RRAM 28 may perform a read operation as above-described according to an exemplary embodiment of the inventive concept.

N-bit data (where, N is 1 or constant greater than 1) processed/to be processed by the CPU 22 may be stored in the RRAM 28 through the memory controller 26. Although not shown, an application chipset, a camera image processor (CIS), a mobile DRAM, or the like may be further applied to the memory system 20 according to the inventive concept. The memory controller 26 and the MRAM may be, for example, constituted by a solid state drive/disk (SSD).

In FIGS. 12 and 13, when the RRAM performs a read operation, since a reference current is generated from a reference memory cell of which line resistance mismatch with respect to the selected normal memory cell is minimized, a read error rate may be reduced. Thus, read operation errors may be reduced so that operation reliability is increased in the smart card or the system.

Figure 14:
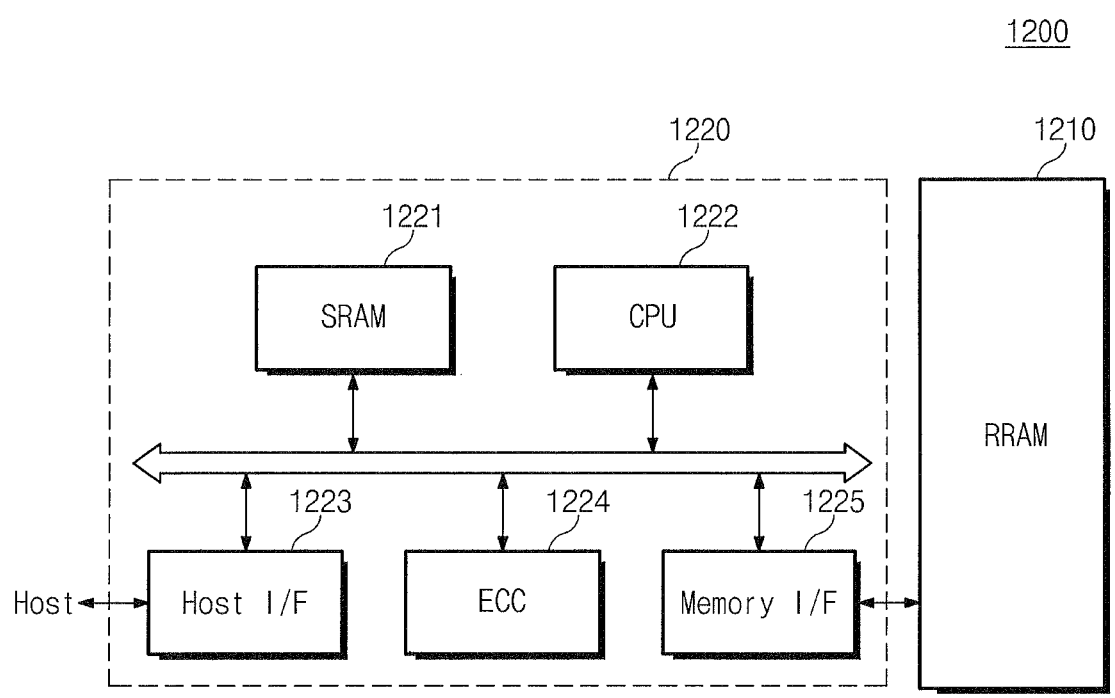
FIG. 14 is a block diagram illustrating a memory card according to an exemplary embodiment of the present inventive concept.

FIG. 14 is a block diagram illustrating a memory card according to an exemplary embodiment of the inventive concept.

A RRAM 1210 having a memory array according to an exemplary embodiment of the inventive concept may be applicable to a memory card 1200. For example, the memory card 1200 may include a memory controller 1220 for controlling overall data exchange between a host and the RRAM 1210.

An SRAM 1221 may be used as an operation memory of a CPU 1222 within the memory controller 1220. A host interface 1223 may include a data exchange protocol of a host coupled to the memory card 1200. An error correction code (ECC) 1224 may detect and correct errors contained in data read from the resistive memory device 1210. A memory interface 1225 performs an interface between the resistive memory device 1210 and the memory controller 1220. The CPU 1222 performs an overall control operation for data exchange of the memory controller 1220.

Since data stored in a selected memory cell of the RRAM 1210 is sensed by a reference current generated from the selected memory cell and a reference memory cell such as a word line resistor or bit line resistor, reliability of the read operation may be increased. Thus, since a read error rate occurring due to a cell characteristic change is reduced, the memory card may have increased operation performance.

Figure 15:
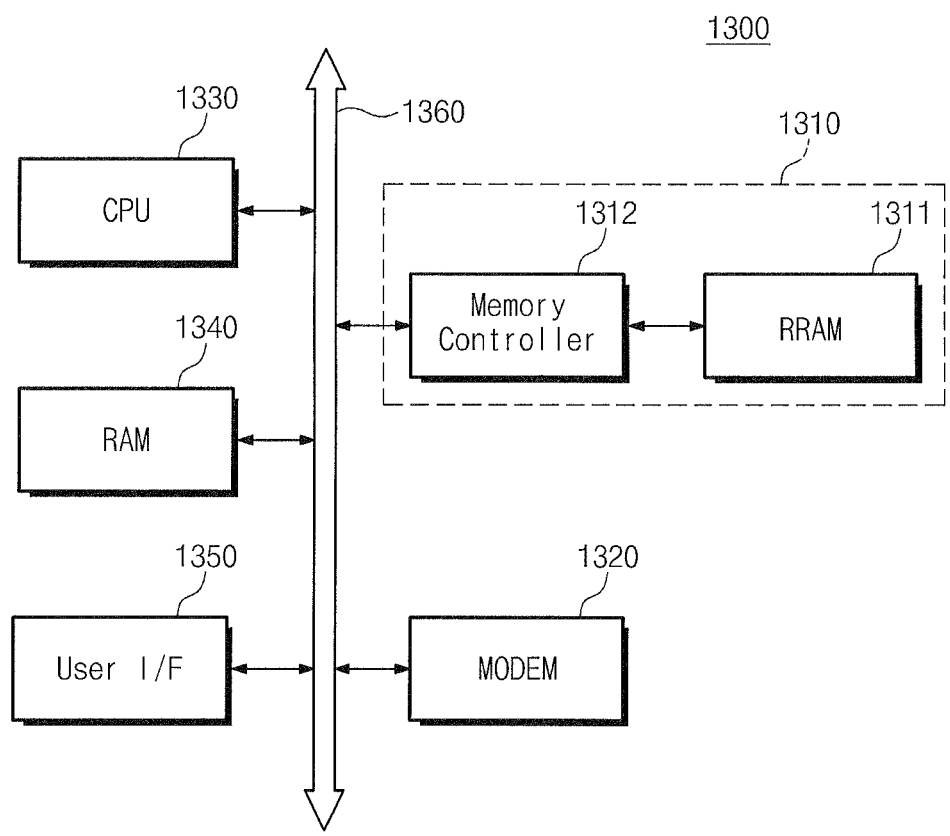
FIG. 15 is a block diagram illustrating an information processing system according to an exemplary embodiment of the present inventive concept.

FIG. 15 is a block diagram illustrating an information processing system according to an exemplary embodiment of the inventive concept.

Referring to FIG. 15, an information processing system 1300 includes a memory system 1310 including an RRAM 1311 according to an exemplary embodiment of the inventive concept. The information processing system 1300 may include a mobile device or a computer. For example, the information processing system 1300 includes the memory system 1310, a modem 1320 electrically coupled to a system bus 1360, a CPU 1330, a RAM 1340, and an user interface 1350. Data processed by the CPU 1330 or data inputted from an external device is stored in the memory system 1310. The information processing system 1300 may be provided as a solid state disk (SSD), a camera image sensor, and other application chipsets. For example, the memory system 1310 may be constituted by the SSD. In this case, the information processing system 1300 may stably and reliably store large-capacity data in the memory system 1310.

When a selected memory cell of the RRAM 1311 constituting the memory system 1310 together with the memory controller 1312 performs a read operation, a reference current for sensing data may be generated from a reference memory cell having a line resistance mismatch with respect to the selected memory cell among the reference memory cells within a sub reference cell array block. Thus, since the sensing margin is secured without reducing the sensing margin, performance of the information processing system may be increased.

According to an exemplary embodiment of the inventive concept, a line resistance mismatch between a normal memory cell and a reference memory cell may be reduced to improve a sensing margin. Therefore, a read error rate may be minimized or reduced to improve the reliability of the read operation.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A resistive memory device comprising:
a memory cell array block having a plurality of memory cells and at least one reference cell array block having a plurality of reference cells, wherein each of the memory cell array block and the at least one reference cell array block includes a respective plurality of row lines and a respective plurality of bit lines, each row line intersecting each bit line without being in contact, wherein each bit line is coupled, through each memory cell or reference cell, to each row line at each intersection;
a selection unit configured:
to select an Mth bit line and an Nth row line from each of the memory cell array block and the at least one reference cell array blocks, and
to cause cell current to flow through a selected memory cell that is disposed at a region where the Mth bit line and the Nth row line intersect each other in the memory cell array block and at least one reference current to flow through the at least one reference cell that is disposed at a region where the Mth bit line and the Nth row line intersect each other in the at least one reference cell array blocks;
a first sink transistor coupled to an end of the Nth row line of the memory cell array block;
a second sink transistor coupled to an opposite end of the Nth row line of the memory cell array block;
a third sink transistor coupled to an end of the Nth row line of each of the at least one reference cell array blocks;
a fourth sink transistor coupled to an opposite end of the Nth row line of each of the at least one reference cell array blocks; and
a word line coupled to a gate of the first sink transistor, a gate of the second sink transistor, a gate of the third sink transistor, and a gate of the fourth sink transistor,
wherein the selection unit is further configured to select the word line.

2. The resistive memory device of claim 1, wherein each of the plurality of the memory cells comprises a multi-level cell storing at least 2-bit data.

3. The resistive memory device of claim 2, wherein, when the selected memory cell stores 2-bit data, the at least one reference cell array blocks comprises three reference cell array blocks and the at least one reference current comprises three levels of reference cell current.

4. The resistive memory device of claim 1, wherein a number of memory cells coupled to each bit line of the memory cell array block is equal to a number of reference cells coupled to each bit line of the at least one reference cell array blocks.

5. The resistive memory device of claim 4, wherein a number of memory cells coupled to each row line of the memory cell array block is equal to a number of reference cells coupled to each row line of the at least one reference cell array blocks.

6. The resistive device of claim 1, further comprising:
a sense amplifier configured to determine a data state of the selected memory cell, wherein the sense amplifier comprising;
a current mirror configured to mirror one of the at least one reference current to a first node;
an active clamping device coupled to the first node and configured to provide a fixed voltage to a second node, wherein the second node is coupled to a cell current path including the Mth bit line, the selected memory cell, and the Nth row line that are coupled to each other in series; and
a comparator having a first input coupled to a reference voltage and a second input coupled to the first node, wherein a voltage of the first node is determined by a difference of the cell current and the one of the at least one reference current.

7. The resistive device of claim 6, wherein the one of the at least one reference current flows through one of the at least one reference cells, the Mth bit line, the Nth row line that are coupled to each other in series.

8. The resistive device of claim 7, wherein each of the first and second sink transistors includes an N-type MOS transistor.

9. A resistive memory device comprising:
a plurality of memory cell array blocks and a reference cell array block, wherein each of the plurality of the memory cell array block and the reference cell array block includes a respective plurality of row lines and a respective plurality of bit lines, each row line intersecting each bit line without being in contact;
a column decoder configured to select one of the plurality of the memory cell array blocks and an Mth bit line of a selected memory cell array block of the plurality of memory cell array blocks;
a reference column decoder configured to select an Mth bit line of the reference cell array block when the column decoder selects the Mth bit line of the selected memory cell array block;
a first sink transistor coupled to an end of the respective row line of the selected memory cell array block;
a second sink transistor coupled to an opposite end of the respective row line of the selected memory cell array block;

a third sink transistor coupled to an end of the respective row line of the reference cell array block;

a fourth sink transistor coupled to an opposite end of the respective row line of the reference cell array block; and a plurality of word lines, wherein each word line is coupled to a gate of the first to fourth sink transistor.

10. The resistive memory device of claim 9, further comprising:

a row decoder configured to select one of the plurality of word lines.

11. The resistive memory device of claim 9, wherein a number of the respective plurality of the row lines of the selected memory cell array block is equal to a number of the respective plurality of the row lines of the reference cell array block.

12. The resistive memory device of claim 11, wherein a number of the respective plurality of the bit lines of the selected memory cell array block is equal to a number of the respective plurality of the bit lines of the reference cell array block.

13. The resistive memory device of claim 9, wherein the Mth bit line of the selected memory cell array block and the reference cell array block is disposed at substantially the same position in the selected memory cell array block and the reference cell array block.

14. The resistive device of claim 9, wherein the first to fourth sink transistors include an N-type MOS transistor.

* * * * *